United States Patent
Lee et al.

(10) Patent No.: US 9,502,177 B2
(45) Date of Patent: Nov. 22, 2016

(54) MULTILAYER CERAMIC CAPACITOR AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventors: Kyo Kwang Lee, Suwon-Si (KR); Sang Soo Park, Suwon-Si (KR); Young Ghyu Ahn, Suwon-Si (KR); Byoung Hwa Lee, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/042,272

(22) Filed: Feb. 12, 2016

(65) Prior Publication Data

US 2016/0163456 A1    Jun. 9, 2016

Related U.S. Application Data

(63) Continuation of application No. 14/275,643, filed on May 12, 2014, now Pat. No. 9,384,892.

(30) Foreign Application Priority Data

Jun. 14, 2013 (KR) .......................... 10-2013-0068497

(51) Int. Cl.
*H01G 4/30* (2006.01)
*H01G 4/005* (2006.01)
(Continued)

(52) U.S. Cl.
CPC ............. *H01G 4/005* (2013.01); *H01G 4/012* (2013.01); *H01G 4/12* (2013.01); *H01G 4/232* (2013.01);
(Continued)

(58) Field of Classification Search
CPC ........ H01G 4/30; H01G 4/005; H01G 4/228; H01G 4/008
See application file for complete search history.

(56) References Cited

U.S. PATENT DOCUMENTS 6,606,237 B1    8/2003 Naito et al.
7,706,123 B2 *  4/2010 Togashi ................. H01G 4/012
                                                          361/303
(Continued)

FOREIGN PATENT DOCUMENTS

JP    2007-103496 A    4/2007
JP    2007-194312 A    8/2007
(Continued)

OTHER PUBLICATIONS

European Search Report dated Nov. 27, 2014, issued in corresponding European Patent Application No. 14275115.5.
(Continued)

*Primary Examiner* — Nguyen Ha
(74) *Attorney, Agent, or Firm* — McDermott Will & Emery LLP

(57) ABSTRACT

A multilayer ceramic capacitor may include: a ceramic body including dielectric layers and having first and second main surfaces opposing each other, first and second side surfaces opposing each other, and first and second end surfaces opposing each other; an active layer configured to form capacitance by including first and second internal electrodes disposed to face each other with the dielectric layer interposed therebetween and alternately exposed to the first or second side surface; and a first external electrode disposed on the first side surface and electrically connected to the first internal electrodes and a second external electrode disposed on the second side surface and electrically connected to the second internal electrodes. When length of the ceramic body is L and length of the first and second external electrodes in the length direction of the ceramic body is L1, $0.2 \leq L1/L \leq 0.96$ is satisfied.

20 Claims, 6 Drawing Sheets

(51) Int. Cl.
*H01G 4/012* (2006.01)
*H01G 4/12* (2006.01)
*H01G 4/232* (2006.01)
*H05K 1/11* (2006.01)
*H05K 1/18* (2006.01)
*H01G 2/06* (2006.01)

(52) U.S. Cl.
CPC ............. *H01G 4/30* (2013.01); *H05K 1/111* (2013.01); *H05K 1/181* (2013.01); *H01G 2/065* (2013.01); *H05K 2201/09427* (2013.01); *H05K 2201/10015* (2013.01); *Y02P 70/611* (2015.11)

(56) References Cited

U.S. PATENT DOCUMENTS

| | | |
|---|---|---|
| 2001/0015884 A1 | 8/2001 | Takeshima et al. |
| 2008/0158773 A1 | 7/2008 | Lee et al. |
| 2008/0254968 A1 | 10/2008 | Kakuda et al. |
| 2008/0310074 A1 | 12/2008 | Togashi et al. |
| 2008/0310078 A1 | 12/2008 | Lee et al. |
| 2009/0002918 A1 | 1/2009 | Kawasaki et al. |
| 2009/0219666 A1 | 9/2009 | Fukuda |
| 2009/0290281 A1 | 11/2009 | Nagamoto et al. |
| 2012/0298407 A1 | 11/2012 | Ahn et al. |
| 2014/0041915 A1 | 2/2014 | Hattori et al. |
| 2014/0368968 A1* | 12/2014 | Lee ................ H01G 4/005 361/301.4 |

FOREIGN PATENT DOCUMENTS

| | | |
|---|---|---|
| JP | 2007-194313 A | 8/2007 |
| JP | 2008-187037 A | 8/2008 |
| JP | 2008-192757 A | 8/2008 |
| JP | 2013-102232 A | 5/2013 |
| KR | 10-0809239 B1 | 3/2008 |
| KR | 10-2008-0110180 A | 12/2008 |

OTHER PUBLICATIONS

Extended European Search Report issued in European Application No. 14275115.5 dated Apr. 9, 2015.

* cited by examiner

MULTILAYER CERAMIC CAPACITOR AND BOARD HAVING THE SAME MOUNTED THEREON

CROSS-REFERENCE TO RELATED APPLICATION

This application is a continuation of U.S. patent application Ser. No. 14/275,643, filed May 12, 2014, which claims the benefit of Korean Patent Application No. 10-2013-0058497 filed on Jun. 14, 2013, the disclosures of which are incorporated herein by reference.

BACKGROUND

The present disclosure relates to a multilayer ceramic capacitor and a board having the same mounted thereon.

In accordance with the recent trend for miniaturization and high capacitance of electronic products, electronic components used in the electronic products are required to have small size and high capacitance. Therefore, demand for a multilayer ceramic electronic component has been increased.

In the case of a multilayer ceramic capacitor, as equivalent series inductance (hereinafter, referred to as "ESL") increases, performance of an electronic product may deteriorate. In addition, in a case in which an electronic component is miniaturized and capacitance thereof is increased, the influence of an increase in ESL on deterioration in the performance of the electronic product has relatively increased.

A so-called "low inductance chip capacitor (LICC)" is employed to decrease inductance by reducing a distance between external terminals to shorten a current flow path.

Meanwhile, a multilayer ceramic capacitor may have a structure in which a plurality of dielectric layers and internal electrodes having opposite polarities and having at least one of the dielectric layers interposed therebetween are alternately stacked.

Since the dielectric layers have piezoelectric and electrostrictive properties, when direct current (DC) or alternating current (AC) voltage is applied to the multilayer ceramic capacitor, a piezoelectric phenomenon may occur between the internal electrodes, causing vibrations.

Such vibrations may be transferred to a printed circuit board on which the multilayer ceramic capacitor is mounted through solder, such that the entire printed circuit board may become an acoustic reflection surface to transmit the sound of vibrations as noise.

Vibration noise may have a frequency corresponding to an audio frequency within a range of 20 to 20000 Hz, potentially causing listener discomfort. The vibration noise causing listener discomfort, as described above, is known as acoustic noise.

Research into a technology of reducing acoustic noise when the multilayer ceramic electronic component is mounted on the board is still in demand.

SUMMARY

An aspect of the present disclosure is directed to a multilayer ceramic capacitor and a board having the same mounted thereon.

According to an aspect of the present disclosure, a multilayer ceramic capacitor may include: a ceramic body containing a dielectric within which is located a first plurality of internal electrodes and a second plurality of internal electrodes, the first and second plurality of electrodes interleaved with facing each other so as to form a capacitance; a first external electrode disposed on the one side surface of the ceramic body and electrically connected to the first plurality of internal electrodes, and a second external electrode disposed on a second side surface of the ceramic body and electrically connected to the second plurality of internal electrodes, in which $0.2 \leq L1/L \leq 0.96$, wherein L is length in a length direction of the ceramic body, and L1 is a length of the first and second external electrodes in the length direction of the ceramic body.

The multilayer ceramic capacitor may include upper and lower cover layers disposed above and beneath first and second pluralities of internal electrodes, respectively, in which $0.074 \leq L2/(tc \times (L-L2)) \leq 2.410$ wherein tc is thickness of the lower cover layer, L is length of the ceramic body, and L2 is length of the first and second internal electrodes.

The multilayer ceramic capacitor may include upper and lower cover layers disposed above and beneath first and second pluralities of internal electrodes, respectively, in which $0.46 \leq (L-L2)/tc \leq 14.49$ wherein tc is thickness of the lower cover layer, L is length of the ceramic body, and L2 is length of the first and second internal electrodes.

The first and second internal electrodes may include a capacitance part in which adjacent internal electrodes overlap with one another to contribute to forming capacitance and a lead part in which a portion of the capacitance part extends to be exposed to the outside of the ceramic body.

When area of the lead part is defined as S1 and area of a margin part of the ceramic body in the width direction of the ceramic body corresponding to a region between one end of each of the first and second internal electrodes and the other end thereof in the length direction is defined as S2, $0.12 \leq S1/S2 \leq 0.74$ may be satisfied.

The first and second pluralities of internal electrodes are spaced apart from first and second end surfaces of the ceramic body by a predetermined distance.

The first and second external electrodes extend to portions of first and second main surfaces of the ceramic body.

According to another aspect of the present disclosure, a multilayer ceramic capacitor may include: a ceramic body including dielectric layers and having first and second main surfaces opposing each other, first and second side surfaces opposing each other, and first and second end surfaces opposing each other; an active layer configured to form capacitance by including a plurality of first and second internal electrodes disposed to face each other with at least one of the dielectric layers interposed therebetween and alternately exposed to the first or second side surface; upper and lower cover layers disposed on and below the active layer, respectively; and a first external electrode disposed on the first side surface of the ceramic body and electrically connected to the first internal electrodes and a second external electrode disposed on the second side surface of the ceramic body and electrically connected to the second internal electrodes, wherein when the thickness of the lower cover layer is defined as tc, the length of the ceramic body is defined, as L, and the length of the first and second internal electrodes is defined as L2, $0.074 \leq L2/(tc \times (L-L2)) \leq 2.410$ may be satisfied.

When the thickness of the lower cover layer is defined as tc, the length of the ceramic body is defined as L, and the length of the first and second internal electrodes is defined as L2, $0.46 \leq (L-L2)/tc \leq 14.49$ may be satisfied.

The first and second internal electrodes may include a capacitance part in which adjacent internal electrodes overlap with one another to contribute to forming capacitance and a lead part in which a portion of the capacitance part extends to be exposed to the outside the ceramic body.

When area of the lead part is defined as Si and area of a margin part of the ceramic body in the width direction of the ceramic body corresponding to a region between one end of each of the first and second internal electrodes and the other end thereof in the length direction is defined as S2, $0.12 \leq S1/S2 \leq 0.74$ may be satisfied.

The first and second internal electrodes may be spaced apart from the first and second end surfaces of the ceramic body by a predetermined distance.

The first and second external electrodes may be extended to portions of the first and second main surfaces of the ceramic body.

According to another aspect of the present disclosure, a board having a multilayer ceramic capacitor mounted thereon may include: a printed circuit board having first and second electrode pads disposed thereon; and a multilayer ceramic capacitor mounted on the printed circuit board, wherein the multilayer ceramic capacitor includes: a ceramic body including dielectric layers and having first and second main surfaces opposing each other, first and second side surfaces opposing each other, and first and second end surfaces opposing each other; an active layer configured to form capacitance by including a plurality of first and second internal electrodes disposed to face each other with at least one of the dielectric layers interposed therebetween and alternately exposed to the first or second side surface; upper and lower cover layers disposed on and below the active layer, respectively; and a first external electrode disposed on the first side surface of the ceramic body and electrically connected to the first internal electrodes and a second external electrode disposed on the second side surface of the ceramic body and electrically connected to the second internal electrodes, when length of the ceramic body is defined as L and length of the first and second external electrodes in a length direction of the ceramic body is defined as L1, $0.2 \leq L1/L \leq 0.96$ may be satisfied.

When thickness of the lower cover layer is defined as tc, length of the ceramic body is defined as L, and length of the first and second internal electrodes is defined as L2, $0.074 \leq L2/(tc \times (L-L2)) \leq 2.410$ may be satisfied.

When thickness of the lower cover layer is defined as tc, length of the ceramic body is defined as L, and length of the first and second internal electrodes is defined as L2, $0.46 \leq (L-L2)/tc \leq 14.49$ may be satisfied.

The first and second internal electrodes may include a capacitance part in which adjacent internal electrodes are overlapped with one another to contribute to forming capacitance and a lead part in which a portion of the capacitance part is extended to be exposed to the outside of the ceramic body.

When area of the lead part is defined as S1 and area of a margin part of the ceramic body in the width direction of the ceramic body corresponding to a region between one end of each of the first and second internal electrodes and the other end thereof in the length direction is defined as S2, $0.12 \leq S1/S2 \leq 0.74$ may be satisfied.

The first and second internal electrodes may be spaced apart from the first and second end surfaces of the ceramic body by a predetermined distance.

The first and second external electrodes may extendeto portions of the first and second main surfaces of the ceramic body.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
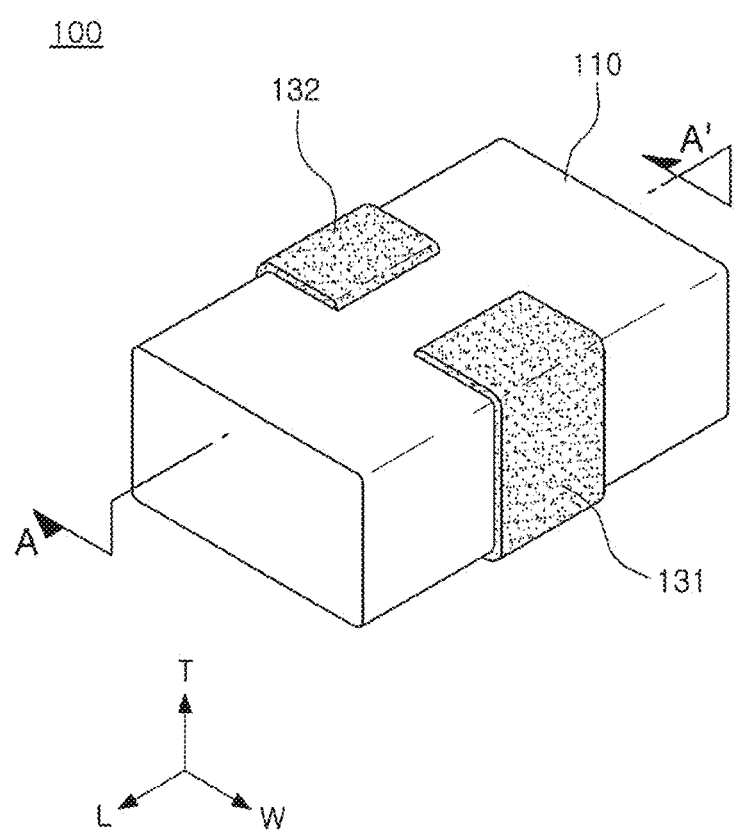
FIG. 1 is a perspective view showing a multilayer ceramic capacitor according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions elements may be exaggerated for clarity, and the same reference numerals will be used throughout to designate the same or like elements.

Multilayer Ceramic Capacitor

FIG. 1 is a perspective view showing a multilayer ceramic capacitor according to an exemplary embodiment of the present disclosure.

Figure 2:
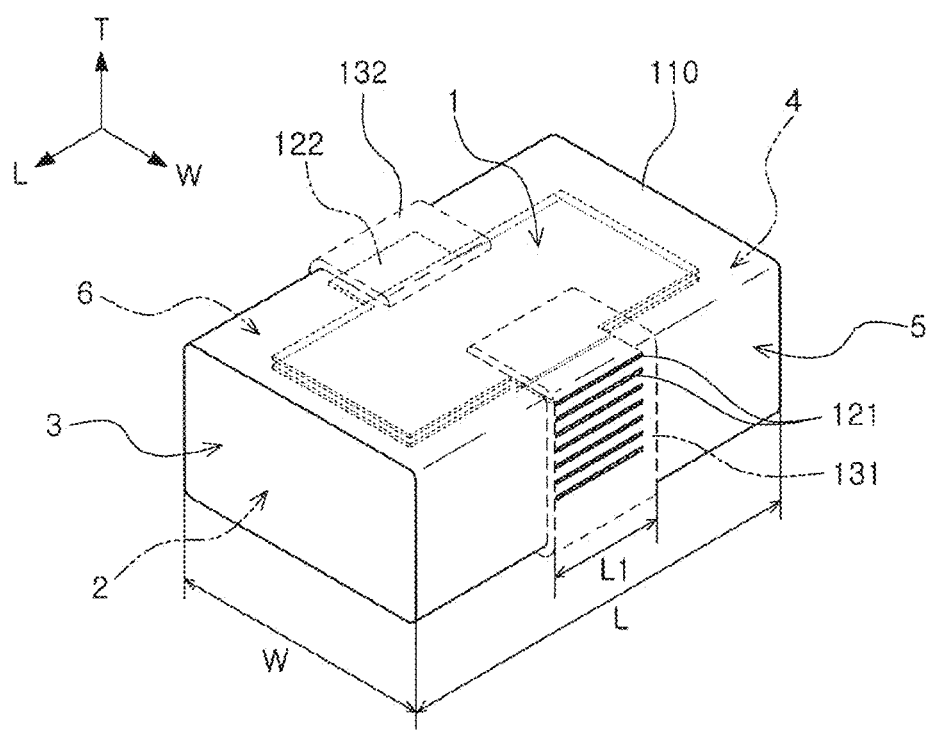
FIG. 2 is a view showing a ceramic body according to an exemplary embodiment of the present disclosure.

FIG. 2 is a view showing a ceramic body according to an exemplary embodiment of the present disclosure.

Figure 3:
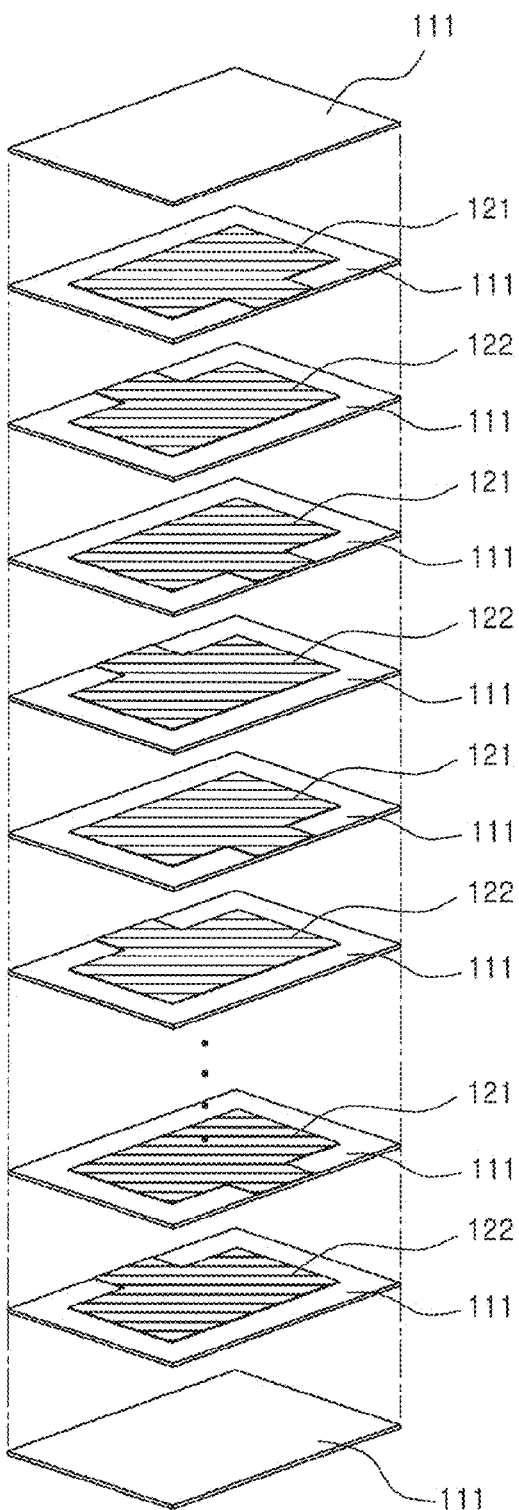
FIG. 3 is an exploded perspective view of FIG. 2.

FIG. 3 is an exploded perspective view of FIG. 2.

Figure 4:
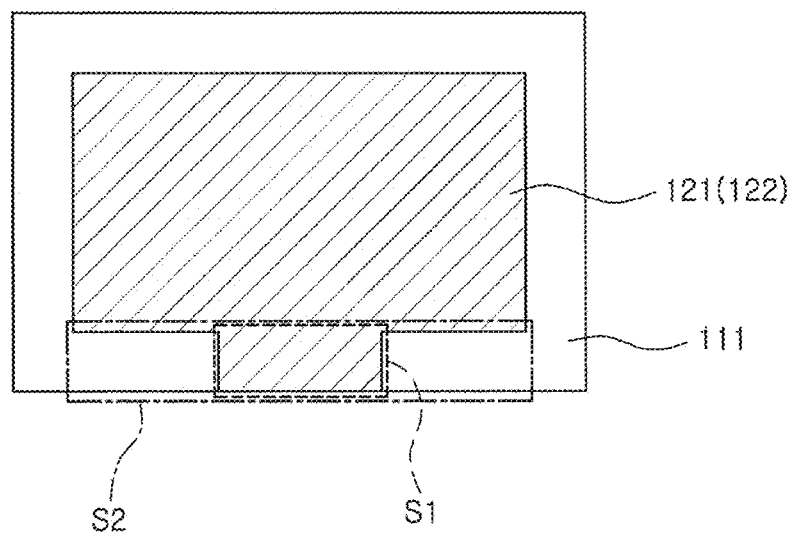
FIG. 4 is a plan view showing an internal electrode multilayer ceramic capacitor according to an exemplary embodiment of the present disclosure.

FIG. 4 is a plan view showing an internal electrode of the multilayer ceramic capacitor according to the exemplary embodiment of the present disclosure.

Figure 5:
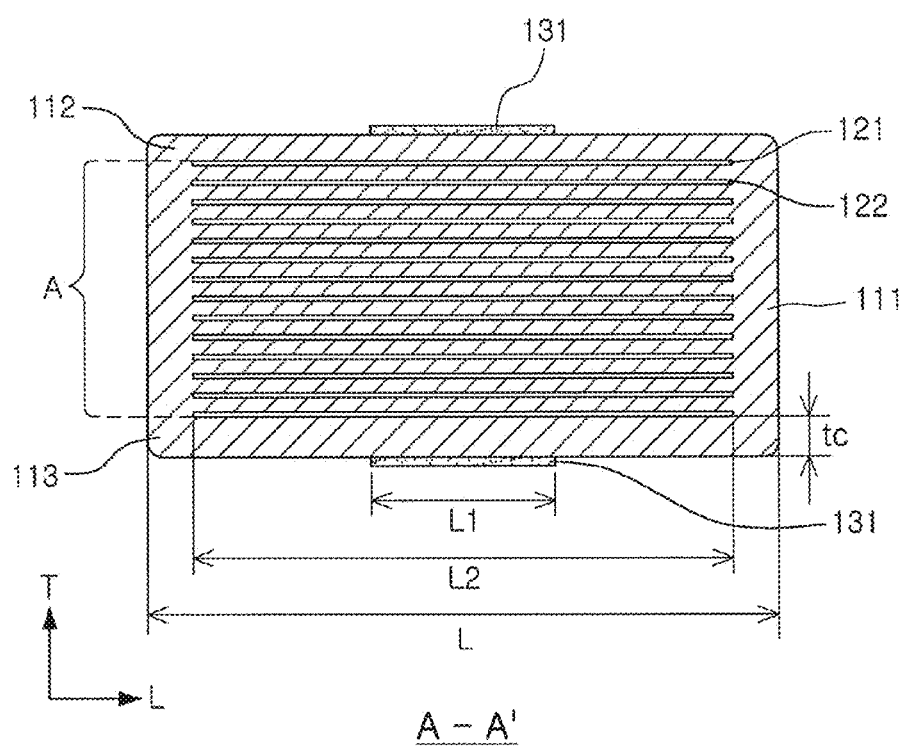
FIG. 5 is a cross-sectional view taken along line A-A' of FIG. 1.

FIG. 5 is a cross-sectional view taken along line A-A' of FIG. 1.

Referring to FIGS. 1 through 5, a multilayer ceramic capacitor 100 according to an exemplary embodiment of the present disclosure may include a ceramic body 110 including dielectric layers 111 and having first and second main surfaces 1 and 2 opposing each other, first and second side surfaces 5 and 6 opposing each other, and first and second end surfaces 3 and 4 opposing each other; an active layer A configured to form capacitance by including a plurality of first and second internal electrodes 121 and 122 disposed to face each other with at least one of the dielectric layers 111 interposed therebetween and alternately exposed to the first or second side surface 5 or 6; upper and lower cover layers 112 and 113 formed on and below the active layer A, respectively; and a first external electrode 131 formed on the first side surface 5 of the ceramic body 110 and electrically connected to the first internal electrodes 121 and a second external electrode 132 formed on the second side surface 6 and electrically connected to the second internal, electrodes 122, wherein when length of the ceramic body 110 is defined as L and length of the first and second external electrodes 131 and 132 in the length direction of the ceramic body 110 is defined as L1, $0.2 \leq L1/L \leq 0.96$ may be satisfied.

Hereinafter, a multilayer ceramic electronic component according to an exemplary embodiment of the present disclosure will be described. Particularly, a multilayer ceramic capacitor will be described by way of example, but the present inventive concept is not limited thereto.

Referring to FIG. 1, in the multilayer ceramic capacitor according to the exemplary embodiment of the present disclosure, 'length direction' refers to the 'L' direction of FIG. 1, 'width direction' refers to the 'W' direction of FIG. 1, and 'thickness direction' refers to the 'T' direction of FIG. 1. Here, the 'thickness direction' may be the same as the direction in which dielectric layers are stacked, that is, a 'stacked direction'.

Referring to FIG. 2, in the exemplary embodiment of the present disclosure, the ceramic body 110 may have the first and second main surfaces 1 and 2 opposing each other, and the first and second side surfaces 5 and 6 and the first and second end surfaces 3 and 4 that connect the first and second main surfaces 1 and 2 to each other. The shape of the ceramic body 110 is not particularly limited, but may be hexahedral as shown.

Referring to FIG. 3, the raw material forming the dielectric layers 111 is not particularly limited as long as sufficient capacitance may be obtained, but may be, for example, barium titanate ($BaTiO_3$) powder.

The material for the dielectric layer 111 may further contain various ceramic additives, organic solvents, plasticizers, binders, dispersing agents, or the like, according to intended use of the capacitor, in addition to ceramic powder such as barium titanate ($BaTiO_3$) powder, the like.

The average particle size of the ceramic powder used to form the dielectric layers 111 is not particularly limited, and may be controlled, for example, to be 400 nm or less.

The material for the first and second internal electrodes 121 and 122 is not particularly limited. For example, the first and second internal electrodes 121 and 122 may be formed of a conductive paste including at least one of a noble metal material such as palladium (Pd), a palladium-silver (Pd—Ag) alloy, or the like, nickel (Ni), and copper (Cu).

The first and second internal electrodes 121 and 122 may be disposed to face each other with at least one of the dielectric layers 111 interposed therebetween, and may be alternately exposed to the first or second side surface 5 or 6.

The first and second internal electrodes 121 and 122 are alternately exposed to the first or second side surface 5 or 6, such that a reverse geometry capacitor (RGC) or low inductance chip capacitor (LICC) may be obtained as described below.

The first and second internal electrodes 121 and 122 may include a capacitance part in which adjacent internal electrodes overlapp with one another to contribute to forming capacitance, and a lead part in which a portion of the capacitance part extends to be exposed to the outside of the ceramic body.

The lead part is not particularly limited, but for example, the length of the lead part is shorter than the length of the internal electrode configuring the capacitance part in the length direction of the ceramic body 110.

In a general multilayer ceramic electronic component, external electrodes may be disposed on opposing end surfaces of a ceramic body in the length direction thereof.

In this case, when an alternating current (AC) voltage is applied to the external electrodes, current path is relatively long, whereby the intensity of induced magnetic field may be increased, resulting in an increase in inductance.

In order to solve this problem, the first and second external electrodes 131 and 132 in the exemplary embodiment of the present disclosure may be disposed on the first and second side surfaces 5 and 6 of the ceramic body 110 opposing each other in the width direction so as to reduce the length of the current path.

In this case, since the distance between the first and second external electrodes 131 and 132 is relatively short, the current path length may be reduced, resulting in a reduction in inductance.

As described above, the first and second external electrodes 131 and 132 may be formed on the first and second side surfaces 5 and 6 of the ceramic body 110 opposing each other in the width direction and may be electrically connected to the first and second internal electrodes 121 and 122 in order to form capacitance.

The first and second external electrodes 131 and 132 may be formed of the same conductive material as that of the first and second internal electrodes 121 and 122, but are not limited thereto. For example, the first and second external electrodes 131 and 132 may be formed of a metal powder including copper (Cu), silver (Ag), nickel (Ni), or the like.

The first and second external electrodes 131 and 132 may be formed by applying a conductive paste prepared by adding glass frits to the metal powder to the ceramic body and then sintering the applied conductive paste.

The width W of the ceramic body 110 may be a distance between the first side surface 5 on which the first external electrode 131 is formed and the second side surface 6 on which the second external electrode 132 is formed, and the length L of the ceramic body 110 may be a distance between the first and second end surfaces 3 and 4.

According to the exemplary embodiment of the present disclosure, the distance between the first and second side surfaces 5 and 6 on which the first and second external electrodes 131 and 132 are formed, respectively, may be less than or equal to the distance between the first and second end surfaces 3 and 4.

Since the distance between the first and second external electrodes 131 and 132 is shortened, current path length may be shortened, resulting in a reduction in inductance.

As described above, the multilayer ceramic capacitor, in which the first and second external electrodes 131 and 132 are formed on the first and second side surfaces 5 and 6 of the ceramic body 110, may be a reverse geometry capacitor (RGC) or low inductance chip capacitor (LICC).

Referring to FIG. 4, in the multilayer ceramic capacitor according to the exemplary embodiment of the present disclosure, when area of the lead part is defined as S1 and area of a margin part of the ceramic body 110 in the width direction of the ceramic body, corresponding to a region between one end of each of the first and second internal electrodes 121 and 122 and the other end thereof in the length direction is defined as S2, $0.12 \leq S1/S2 \leq 0.74$ may be satisfied.

By controlling the ratio of the area S1 of the lead part and the area S2 of the margin part of the ceramic body 110 in the width direction of the ceramic body corresponding to the region between one ends of the first and second internal electrodes 121 and 122 and the other ends thereof in the length direction to satisfy $0.12 \leq S1/S2 \leq 0.74$, acoustic noise may be reduced and excellent reliability may be implemented in the multilayer ceramic capacitor.

In the case in which the ratio S1/S2 of the area S1 of the lead part to the area S2 of the margin part of the ceramic body 110 in the width direction of the ceramic body corresponding to the region between one ends of the first and second internal electrodes 121 and 122 and the other ends thereof in the length direction is less than 0.12, delamination may occur in the multilayer ceramic capacitor.

In the case in which the ratio S1/S2 of the area S1 of the lead part to the area S2 of the margin part of the ceramic body 110 in the width direction the ceramic body corresponding to the region between one ends of the first and second internal electrodes 121 and 122 and the other ends thereof in the length direction is greater than 0.74, acoustic noise may be increased.

Referring to FIG. 5, the ceramic body 110 may be configured of the active layer A contributing to forming capacitance of the capacitor and the upper and lower cover layers 112 and 113 formed on and below the active layer A, respectively, as upper and lower margin parts.

The active layer A may be formed by repeatedly stacking the plurality of first and second internal electrodes 121 and 122 with at least one of the dielectric layers 111 interposed therebetween.

Meanwhile, in the multilayer ceramic capacitor according to the exemplary embodiment of the present disclosure, when the length of the ceramic body 110 is defined as L and the length of the first and second external electrodes 131 and 132 in the length direction of the ceramic body 110 is defined as L1, $0.2 \leq L1/L \leq 0.96$ may be satisfied.

By controlling the ratio L1/L of the length L1 of the first and second external electrodes 131 and 132 in the length direction of the ceramic body 110 to the length L of the ceramic body 110 to satisfy $0.2 \leq L1/L \leq 0.96$, acoustic noise may be reduced and excellent reliability may be implemented in the multilayer ceramic capacitor.

In the case in which the ratio L1/L of the length L1 of the first and second external electrodes 131 and 132 in the length direction of the ceramic body 110 to the length L of the ceramic body 110 is less than 0.2, the mounting area of the capacitor on a board may be reduced, whereby adhesion strength may be decreased, and a pick-up defect may occur when a chip is moved.

In the case in which the ratio L the length L1 of the first and second external electrodes 131 and 132 in the length direction of the ceramic body 110 to the length L of the ceramic body 110 is greater than 0.96, acoustic noise may be increased.

Meanwhile, when thickness of the lower cover layer 113 is defined as tc, length of the ceramic body 110 is defined as L, and length of the first and second internal electrodes 121 and 122 is defined as L2, $0.074 \leq L2/(tc \times (L-L2)) \leq 2.410$ may be satisfied.

By controlling the thickness tc of the lower cover layer 113, the length L of the ceramic body 110, and the length L2 of the first and second internal electrodes 121 and 122 to satisfy $0.074 \leq L2/(tc \times (L-L2)) \leq 2.410$, acoustic noise may be reduced and excellent reliability may be implemented in the multilayer ceramic capacitor.

In the case in which $(L2/(tc \times (L-L2)))$ defining the relationship between the thickness tc of the lower cover layer 113, the length L of the ceramic body 110, and the length L2 of the first and second internal electrodes 121 and 122 is less than 0.074, acoustic noise may be increased.

In the case in which $(L2/(tc \times (L-L2)))$ defining the relationship between the thickness tc of the lower cover layer 113, the length L of the ceramic body 110, and the length L2 of the first and second internal electrodes 121 and 122 is greater than 2.410, a moisture resistance defect may occur, whereby reliability of the multilayer ceramic capacitor may deteriorate.

Meanwhile, according to the exemplary embodiment of the present disclosure, when the thickness of the lower cover layer 113 is defined as tc, the length of the ceramic body 110 is defined as L, and the length of the first and second internal electrodes 121 and 122 is defined as L2, $0.46 \leq (L-L2)/tc \leq 14.49$ may be satisfied.

By controlling the thickness tc of the lower cover layer 113, the length L of the ceramic body 110, and the length L2 of the first and second internal electrodes 121 and 122 to satisfy the following Equation: $0.46 \leq (L-L2)/tc \leq 14.49$, acoustic noise may be reduced and excellent reliability may be implemented in the multilayer ceramic capacitor.

In the case in which. $((L-L2)/tc)$ defining the relationship between the thickness tc of the lower cover layer 113, the length L of the ceramic body 110, and the length L2 of the first and second internal electrodes 121 and 122 is less than 0.46, acoustic noise may be increased.

In the case in which $((L-L2)/tc)$ defining the relationship between the thickness tc of the lower cover layer 113, the length L of the ceramic body 110, and the length L2 of the first and second internal electrodes 121 and 122 is greater than 14.49, a moisture resistance defect may occur, whereby reliability of the multilayer ceramic capacitor may deteriorate.

Further, when the length and the width of the ceramic body 110 are defined as L and W, respectively, $0.5L \leq W \leq L$ may be satisfied. However, the present disclosure is not limited thereto.

By controlling the length and width of the ceramic body to satisfy $0.5L \leq W \leq L$, inductance may be reduced in the multilayer ceramic capacitor.

Therefore, low inductance may be implemented in the multilayer ceramic electronic component according to the exemplary embodiment of the present disclosure, whereby electrical performance may be improved.

Meanwhile, according to the exemplary embodiment of the present disclosure, the thickness of the lower cover layer 113 may he 6.4 to 149.4 μm.

When the thickness of the lower cover layer 113 is controlled to be 6.4 to 149.4 μm, acoustic noise may be reduced and excellent reliability may be implemented in the multilayer ceramic capacitor.

In the case in which the thickness of the lower cover layer 113 is less than 6.4 μm, such an excessively thin cover layer may result in the occurrence of the moisture resistance defect.

In the case in which the thickness of the lower cover layer 113 is greater than 149.4 μm, acoustic noise may be rapidly increased due to displacement of the lower cover layer.

A thickness of the upper cover layer 112 is not particularly limited, and may be equal to or similar to that of the lower cover layer 113. The thickness of the upper cover layer 112 may be within a range preventing the occurrence of the moisture resistance defect.

The first and second internal electrodes 121 and 122 may be spaced apart from the first and second end surfaces 3 and 4 of the ceramic body 110 by a predetermined distance, but are not limited thereto.

Meanwhile, the first and second external electrodes 131 and 132 may be extended to portions of first and second main surfaces 1 and 2 of the ceramic body 110, but are not limited, thereto.

A multilayer ceramic capacitor according to another exemplary embodiment of the present disclosure may include: a ceramic body 110 including dielectric layers 111 and having first and second main surfaces 1 and 2 opposing each other, first and second side surfaces 5 and 6 opposing each other, and first and second end surfaces 3 and 4 opposing each other; an active layer A configured to form capacitance by including a plurality of first and second internal electrodes 121 and 122 disposed to face each other with at least one of the dielectric layers 111 interposed therebetween and alternately exposed to the first or second side surface 5 or 6; upper and lower cover layers 112 and 113 formed on and below the active layer A, respectively; and a first external electrode 131 formed on the first side surface 5 of the ceramic body 110 and electrically connected to the first internal electrodes 121 and a second external electrode 132 formed on the second side surface and electrically connected to the second internal electrodes 122, wherein when thickness of the lower cover layer 113 is defined as tc, a length of the ceramic body 110 is defined as L, and length of the first and second internal electrodes 121 and 122 is defined as L2, $0.074 \leq L2/(tc \times (L-L2)) \leq 2.410$ may be satisfied.

When the thickness of the lower cover layer 113 is defined as tc, the length of the ceramic body 110 is defined as L, and the length of the first and second internal electrodes 121 and 122 is defined as L2, $0.46 \leq (L-L2)/tc \leq 14.49$ may be satisfied.

The first and second internal electrodes 121 and 122 may include a capacitance part in which adjacent internal electrodes are overlapped with one another to contribute to forming capacitance, and a lead part in which a portion of the capacitance part is extended to be exposed to the outside of the ceramic body.

When area of the lead part is defined as S1 and area of a margin part of the ceramic body 110 in the width direction of the ceramic body corresponding to a region between one end of each of the first and second internal electrodes 121 and 122 and the other end thereof in the length direction is defined as S2, $0.12 \leq S1/S2 \leq 0.74$ may be satisfied.

The first and second internal electrodes 121 and 122 may be spaced apart from the first and second end surfaces 3 and 4 of the ceramic body 110 by a predetermined distance.

The first and second external electrodes 131 and 132 may extend to portions of the first and second main surfaces of the ceramic body 110.

Since other features of the multilayer ceramic capacitor according to another exemplary embodiment of the present disclosure are the same as those of the above-described multilayer ceramic capacitor according to the previous exemplary embodiment of the present disclosure, a detailed description thereof will be omitted.

Hereinafter, a method of manufacturing a multilayer ceramic capacitor according to an exemplary embodiment of the present disclosure will be described, but is not limited thereto.

In the method of manufacturing a multilayer ceramic capacitor according to this exemplary embodiment of the present disclosure, first, a slurry containing powder such as barium titanate ($BaTiO_3$) powder, or the like, may be applied to carrier films and dried to prepare plurality of ceramic green sheets, thereby forming dielectric layers.

The ceramic green sheets may be manufactured by mixing the ceramic powder, a binder, and a solvent to prepare the slurry and forming the prepared slurry as sheets having a thickness of several μm using a doctor blade method.

Next, a conductive paste for internal electrodes may be prepared to contain 40 to 50 parts by weight of nickel powder, in which an average particle size of nickel powder is 0.1 to 0.2 μm.

After the conductive paste for internal electrodes is applied to the green sheets through a screen printing method to form internal electrodes, 200 to 400 green sheets on which the internal electrodes have been formed may be stacked to form an active layer, and then the ceramic green sheets may be stacked on and below the active layer to form cover layers, thereby forming a ceramic body having first and second main surfaces opposing each other, first and second side surfaces opposing each other, and first and second end surfaces opposing each other.

Then, first and second external electrodes may be formed on the first and second side surfaces of the ceramic body.

Hereinafter, although the present disclosure will be described in detail with reference to Inventive Examples, the present inventive concept is not limited thereto.

EXPERIMENTAL EXAMPLE

Multilayer ceramic capacitors according to Inventive Examples and Comparative Examples were manufactured as follows.

Slurry containing powder such as barium titanate ($BaTiO_3$), or the like, was applied to carrier films and dried to prepare a plurality of ceramic green sheets having a thickness of 1.8 μm.

Next, a nickel conductive paste for internal electrodes was applied to the ceramic green sheets using a screen to form internal electrodes.

About 200 ceramic green sheets were stacked to form a multilayer body. Here, the number of ceramic green sheets having no internal electrode disposed at a lower portion of the multilayer body below the stacked ceramic green sheets having the internal electrodes formed thereon was greater than the number of ceramic green sheets having no internal electrode disposed at an upper portion of the multilayer body above the stacked ceramic green sheets having the internal electrodes formed thereon. Isostatic pressing was performed on the stacked body at 85° C. and 1000 $kgf/cm^2$.

The pressed ceramic multilayer body was cut into individual chips, and each chip was subjected to a de-binding process by being maintained at 230° C. for 60 hours under air atmosphere.

Then, the chip was sintered at 1200° C. under a reduction atmosphere having oxygen partial pressure of $10^{11}$ atm to $10^{-10}$ atm lower than Ni—NiO equilibrium oxygen partial pressure so that the internal electrodes were not oxidized. After sintering, a size of the multilayer chip capacitor was about 1.0 mm×0.5 mm (Length×Width (L×W), 1005 size). Here, manufacturing tolerance was within a range of ±0.1 mm (Length×Width (L×W)), and experiments were performed on samples satisfying such a tolerance range to test delamination, pick-up defect, acoustic noise, moisture resistance, and adhesion strength of each sample.

The pick-up defect test refers to a test for determining whether a defect occurs or not when moving a chip in order to mount the chip on a board.

The tests of the above-mentioned factors were performed on 100 samples, and the moisture resistance test was performed on 400 samples.

The following Table 1 shows whether or not delamination occurred, an acoustic noise measurement value, whether or not the pick-up defect occurred, and whether or not an adhesion defect occurred, according to the ratio S1/S2 of the area S1 of the lead part to the area S2 of the margin part of the ceramic body 110 in the width direction of the ceramic body corresponding to the region between one ends of first and second internal electrodes 121 and 122 and the other ends thereof in the length direction and the ratio L1/L of the length L1 the first and second external electrodes 131 and 132 in the length direction of the ceramic body 110 to the length L of the ceramic body 110.

TABLE 1

| No | S1/S2 ratio | L1/L ratio | Internal Delamination (%) | Adhesion Strength Defect Ratio (%) | Pick up Defect | A/N |
|---|---|---|---|---|---|---|
| *1 | 0.01 | 0.09 | 35 | 56 | x | 20.1 |
| *2 | 0.03 | 0.12 | 12 | 23 | Δ | 20.3 |
| *3 | 0.05 | 0.14 | 5 | 15 | Δ | 20.7 |
| *4 | 0.08 | 0.17 | 3 | 4 | ○ | 21.4 |
| 5 | 0.12 | 0.21 | 0 | 0 | ⊚ | 21.8 |
| 6 | 0.16 | 0.25 | 0 | 0 | ⊚ | 22.4 |
| 7 | 0.19 | 0.29 | 0 | 0 | ⊚ | 22.7 |
| 8 | 0.23 | 0.33 | 0 | 0 | ⊚ | 22.9 |
| 9 | 0.27 | 0.36 | 0 | 0 | ⊚ | 23.3 |
| 10 | 0.31 | 0.42 | 0 | 0 | ⊚ | 23.5 |
| 11 | 0.35 | 0.46 | 0 | 0 | ⊚ | 24.2 |
| 12 | 0.39 | 0.50 | 0 | 0 | ⊚ | 24.6 |
| 13 | 10.43 | 0.54 | 0 | 0 | ⊚ | 24.8 |
| 14 | 10.47 | 0.58 | 0 | 0 | ⊚ | 25.5 |
| 15 | 0.50 | 0.63 | 0 | 0 | ⊚ | 26.6 |
| 16 | 0.54 | 0.67 | 0 | 0 | ⊚ | 27.3 |
| 17 | 0.58 | 0.71 | 0 | 0 | ⊚ | 28.3 |
| 18 | 0.62 | 0.75 | 0 | 0 | ⊚ | 29.5 |
| 19 | 0.66 | 0.79 | 0 | 0 | ⊚ | 29.8 |
| 20 | 0.70 | 0.83 | 0 | 0 | ⊚ | 30.2 |
| 21 | 0.74 | 0.88 | 0 | 0 | ⊚ | 30.8 |
| *22 | 0.78 | 0.92 | 0 | 0 | ⊚ | 33.5 |
| *23 | 0.81 | 0.96 | 0 | 0 | ⊚ | 34.3 |
| *24 | 0.85 | 1.00 | 0 | 0 | ⊚ | 34.5 | x: Defect rate of 50% or greater
Δ: Defect rate of 1% to 50%
○: Defect rate of 0.01% to 1%
⊚: Defect rate less than 0.01%
*Comparative Example Referring to Table 1, it can be seen that when the ratio S1/S2 of the area S1 of the lead part to the area S2 of the margin part of the ceramic body 110 in the width direction of the ceramic body corresponding to the region between one end of each of the first and second internal electrodes 121 and 122 and the other end thereof in the length direction satisfied 0.12≤S1/S2≤0.74, the acoustic noise was reduced, and defects such as internal delamination, adhesion, and pick-up did not occur.

Further, it can be seen that when the ratio L1/L of the length L1 of the first and second external electrodes 131 and 132 in the length direction of the ceramic body 110 to the length L of the ceramic body 110 satisfied 0.2≤L1/L≤0.96, the acoustic noise was reduced, and defects such as internal delamination, adhesion, and pick-up did not occur.

On the contrary, it can be seen that in samples 1, 2, 3, and 4 corresponding to Comparative Examples that were out of the numerical ranges of the present inventive concept, defects such as internal delamination, adhesion, and pick-up occurred.

In addition, it can be seen that in samples 22, 23, and 24 corresponding to Comparative Examples that were out of the numerical ranges of the present inventive concept, acoustic noise was increased.

The following Table 2 shows acoustic noise measurement values and the occurrence of moisture resistance defect, according to the thickness tc of the lower cover layer 113, the length L of the ceramic body 110, and the length L2 of the first and second internal electrodes 121 and 122.

TABLE 2

| No | tc | L2 | L | L2/(tc*(L − L2)) | (L − L2)/tc | moisture resistance defect rate | A/N |
|---|---|---|---|---|---|---|---|
| *1 | 3.3 | 1017 | 1111 | 3.287 | 28.48 | 4/400 | 22.5 |
| 2 | 6.6 | 1023 | 1118 | 1.645 | 14.49 | 0/400 | 22.2 |
| 3 | 10.3 | 1022 | 1116 | 1.058 | 9.12 | 0/400 | 22.1 |
| 4 | 15.8 | 1018 | 1115 | 0.667 | 6.15 | 0/400 | 22.5 |
| 5 | 52.3 | 1021 | 1115 | 0.208 | 1.80 | 0/400 | 23.7 |
| 6 | 107.4 | 1016 | 1110 | 0.101 | 0.87 | 0/400 | 24.6 |
| 7 | 149.4 | 1026 | 1119 | 0.074 | 0.62 | 0/400 | 25.0 |
| *8 | 209.6 | 1028 | 1118 | 0.055 | 0.43 | 0/400 | 31.5 |
| *9 | 257.5 | 1025 | 1117 | 0.043 | 0.36 | 0/400 | 34.3 |
| *10 | 3.3 | 1052 | 1134 | 3.894 | 24.87 | 3/400 | 22.8 |
| 11 | 6.7 | 1056 | 1138 | 1.935 | 12.32 | 0/400 | 22.7 |
| 12 | 10.2 | 1061 | 1141 | 1.302 | 7.86 | 0/400 | 21.6 |
| 13 | 15.8 | 1046 | 1129 | 0.801 | 5.27 | 0/400 | 21.9 |
| 14 | 52.3 | 1053 | 1136 | 0.243 | 1.59 | 0/400 | 22.9 |
| 15 | 104.0 | 1056 | 1137 | 0.125 | 0.78 | 0/400 | 24.2 |
| 16 | 149.4 | 1059 | 1140 | 0.087 | 0.54 | 0/400 | 30.6 |
| *17 | 209.6 | 1049 | 1130 | 0.062 | 0.39 | 0/400 | 30.9 |
| *18 | 257.5 | 1053 | 1135 | 0.050 | 0.32 | 0 400 | 33.7 |
| *19 | 3.1 | 1096 | 1175 | 4.479 | 25.63 | 3/400 | 23.2 |
| 20 | 6.4 | 1094 | 1165 | 2.410 | 10.92 | 0/400 | 22.6 |
| 21 | 10.2 | 1092 | 1162 | 1.545 | 6.82 | 0/400 | 21.1 |
| 22 | 15.5 | 1089 | 1159 | 1.009 | 4.47 | 0/400 | 21.2 |
| 23 | 52.1 | 1093 | 1163 | 0.303 | 1.33 | 0/400 | 22.5 |
| 24 | 103.6 | 1095 | 1167 | 0.148 | 0.69 | 0/400 | 23.9 |
| 25 | 147.6 | 1101 | 1170 | 0.109 | 0.46 | 0/400 | 30.7 |
| *26 | 208.7 | 1087 | 1157 | 0.075 | 0.33 | 0/400 | 32.5 |
| *27 | 256.6 | 1091 | 1162 | 0.060 | 0.27 | 0/400 | 34.8 |

*Comparative Example

Referring to Table 2, it can be seen that when the ratios between the thickness tc of the lower cover layer 113, the length L of the ceramic body 110, and the length L2 of the first and second internal electrodes 121 and 122 satisfied 0.074≤L2/(tc×(L−L2))≤2.410 and 0.46≤(L−L2)/tc≤14.49, acoustic noise was reduced, and excellent reliability was implemented in the multilayer ceramic capacitor.

On the contrary, it can be seen that in samples 1, 8 to 10, 17 to 19, 26, and 27 corresponding to Comparative Examples that were out of the numerical ranges of the present inventive concept, acoustic noise was increased, or moisture resistance defect occurred.

Board Having Multilayer Ceramic Capacitor Mounted Thereon

Figure 6:
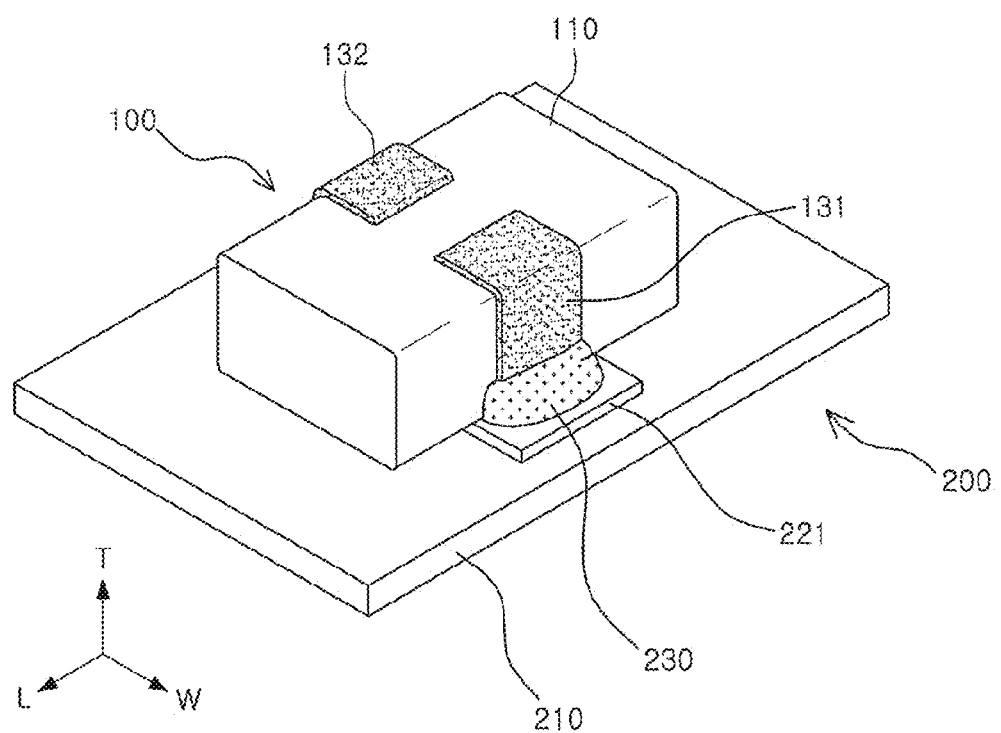
FIG. 6 is a perspective view showing a structure in which the multilayer ceramic capacitor of FIG. 1 is mounted on a printed circuit board.

FIG. 6 is a perspective view showing a structure in which the multilayer ceramic capacitor of FIG. 1 is mounted on a printed circuit board.

Referring to FIG. 6, a board 200 having a multilayer ceramic capacitor 100 mounted thereon according to this exemplary embodiment of the present disclosure may include a printed circuit board 210 on which the multilayer ceramic capacitor 100 is horizontally mounted, and first and second electrode pads 221 and 222 disposed on the printed circuit board 210 to be spaced apart from each other.

In this case, the multilayer ceramic capacitor 100 may be electrically connected to the printed circuit board 210 by a solder 230 in a state in which the lower cover layer 113 is disposed downwards and the first and second external electrodes 131 and 132 are positioned to contact the first and second electrode pads 221 and 222, respectively.

When voltage is applied in a state in the multilayer ceramic capacitor 100 is mounted on the printed circuit board 210 as described above, acoustic noise may be generated.

Here, sizes of the first and second electrode pads 221 and 222 may be an indicator for determining an amount of the solder 230 connecting the first and second external electrodes 131 and 132 of the multilayer ceramic capacitor 100 to the first and second electrode pads 221 and 222, and level of acoustic noise may be controlled according to the amount of the solder 230.

When voltages having opposite polarities are applied to the first and second external electrodes 131 and 132 formed on both side surfaces of the multilayer ceramic capacitor 100 in a state in which the multilayer ceramic capacitor 100 is mounted on the printed circuit board 210, the ceramic body 110 may be expanded and contracted in thickness direction by an inverse piezoelectric effect of the dielectric layers 111, and both side portions of the ceramic body 110 having the first and second external electrodes 131 and 132 formed thereon may contract and expand by the Poisson Effect as opposed to expansion and contraction of the ceramic body 110 in the thickness direction.

More specifically, contraction and expansion of the ceramic body may occur with a displacement of about 20 nm in the thickness direction of the multilayer ceramic capacitor, a displacement of about 4 nm in the length direction thereof, and a displacement of about 2 nm in the width direction thereof.

Here, in the multilayer ceramic capacitor according the exemplary embodiment of the present disclosure, since the first and second external electrodes are formed on both side surfaces of the ceramic body in the width direction of the multilayer ceramic capacitor, displacement in contraction and expansion may be significantly decreased, whereby acoustic noise may be reduced.

As set forth above, according to exemplary embodiments of the present disclosure, since a distance between external electrodes is relatively short, an amount of vibrations generated in a multilayer ceramic capacitor transferred to a board may be reduced, whereby acoustic noise may be reduced.

Further, when the multilayer ceramic capacitor is mounted on the board, a mounting area may be reduced.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor, comprising:
    a ceramic body containing a dielectric within which is located a first plurality of internal electrodes and a second plurality of internal electrodes, the first and second plurality of electrodes interleaved with facing each other so as to form a capacitance;
    a first external electrode disposed on the one side surface of the ceramic body and electrically connected to the first plurality of internal electrodes, and a second external electrode disposed on a second side surface of the ceramic body and electrically connected to the second plurality of internal electrodes,
    wherein $0.2 \leq L1/L \leq 0.96$,
    where L is a length in a length direction of the ceramic body, and L1 is a length of the first and second external electrodes in the length direction of the ceramic body, and
    an overlapped area of the first and second internal electrodes is substantially equal to $(L2 \times W) - (2 \times S2)$,
    where L2 is a length of the first and second internal electrodes, W is a width of the ceramic body and S2 is an area of a margin part of the ceramic body in a width direction of the ceramic body corresponding to a region between one end of each of the first and second internal electrodes and the other end thereof in the length direction.

2. The multilayer ceramic capacitor of claim 1, including upper and lower cover layers disposed above and beneath first and second pluralities of internal electrodes, respectively, in which $$0.074 \leq L2/(tc \times (L-L2)) \leq 2.410$$

wherein tc is thickness of the lower cover layer, L is length of the ceramic body, and L2 is length of the first and second internal electrodes.

3. The multilayer ceramic capacitor of claim 1, in which $$0.46 \leq (L-L2)/tc \leq 14.49$$

wherein tc is thickness of the lower cover layer, L is length of the ceramic body, and L2 is length of the first and second internal electrodes.

4. The multilayer ceramic capacitor of claim 1, wherein the first and second internal electrodes include:
    a capacitance part in which adjacent internal electrodes overlap with one another to contribute to forming capacitance; and
    a lead part in which a portion of the capacitance part extends to be exposed to the outside of the ceramic body.

5. The multilayer ceramic capacitor of claim 4, in which $$0.12 \leq S1/S2 \leq 0.74$$

wherein S1 is an area of the lead part and an area of a margin part of the ceramic body in a width direction of the ceramic body corresponding to a region between one end of each of the first and second internal electrodes and the other end thereof in the length direction is defined as S2.

6. The multilayer ceramic capacitor of claim 1, wherein the first and second pluralities of internal electrodes are spaced apart from first and second end surfaces of the ceramic body by a predetermined distance.

7. The multilayer ceramic capacitor of claim 1, wherein the first and second external electrodes extend to portions of first and second main surfaces of the ceramic body.

8. A multilayer ceramic capacitor, comprising:
    a ceramic body including dielectric layers and having first and second main surfaces opposing each other, first and second side surfaces opposing each other, and first and second end surfaces opposing each other;
    an active layer configured to form capacitance by including a plurality of first and second internal electrodes disposed to face each other with at least one of the dielectric layers interposed therebetween and alternately exposed to the first or second side surface;
    upper and lower cover layers disposed on and below the active layer, respectively; and
    a first external electrode disposed on the first side surface of the ceramic body and electrically connected to the first internal electrodes and a second external electrode disposed on the second side surface of the ceramic body and electrically connected to the second internal electrodes,
    wherein when a thickness of the lower cover layer is defined as tc, a length of the ceramic body is defined as L, and a length of the first and second internal electrodes is defined as L2, $0.074 \leq L2/(tc \times (L-L2)) \leq 2.410$ is satisfied, and
    an overlapped area of the first and second internal electrodes is substantially equal to $(L2 \times W) = (2 \times S2)$, where W is a width of the ceramic body and S2 is an area of a margin part of the ceramic body in a width direction of the ceramic body corresponding to a region between one end of each of the first and second internal electrodes and the other end thereof in the length direction.

9. The multilayer ceramic capacitor of claim 8, wherein when the thickness of the lower cover layer is defined as tc, the length of the ceramic body is defined as L, and the length of the first and second internal electrodes is defined as L2, $0.46 \leq (L-L2)/tc \leq 14.49$ is satisfied.

10. The multilayer ceramic capacitor of claim 8, wherein the first and second internal electrodes include:
  a capacitance part in which adjacent internal electrodes are overlapped with one another to contribute to forming capacitance; and
  a lead part in which a portion of the capacitance part is extended to be exposed to the outside of the ceramic body.

11. The multilayer ceramic capacitor of claim 10, wherein when an area of the lead part is defined as S1 and an area of a margin part of the ceramic body in a width direction of the ceramic body corresponding to a region between one ends of the first and second internal electrodes and the other end thereof in the length direction is defined as S2, $0.12 \leq S1/S2 \leq 0.74$ is satisfied.

12. The multilayer ceramic capacitor of claim 8, wherein the first and second internal electrodes are spaced apart from the first and second end surfaces of the ceramic body by a predetermined distance.

13. The multilayer ceramic capacitor of claim 8, wherein the first and second external electrodes are extended to portions of the first and second main surfaces of the ceramic body.

14. A board having a multilayer ceramic capacitor mounted thereon, the board comprising:
  a printed circuit board having first and second electrode pads disposed thereon; and
  a multilayer ceramic capacitor mounted on the printed circuit board,
  wherein the multilayer ceramic capacitor includes:
  a ceramic body including dielectric layers and having first and second main surfaces opposing each other, first and second side surfaces opposing each other, and first and second end surfaces opposing each other;
  an active layer configured to form capacitance by including a plurality of first and second internal electrodes disposed to face each other with at least one of the dielectric layers interposed therebetween and alternately exposed to the first or second side surface;
  upper and lower cover layers disposed on and below the active layer, respectively; and
  a first external electrode disposed on the first side surface of the ceramic body and electrically connected to the first internal electrodes and a second external electrode disposed on the second side surface of the ceramic body and electrically connected to the second internal electrodes,
  when a length of the ceramic body is defined as L and a length of the first and second external electrodes in a length direction of the ceramic body is defined as L1, $0.2 \leq L1/L \leq 0.96$ is satisfied, and
  an overlapped area of the first and second internal electrodes is substantially equal to $(L2 \times W)-(2 \times S2)$,
  where L2 is a length of the first and second internal electrodes, W is a width of the ceramic body and S2 is an area of a margin part of the ceramic body in a width direction of the ceramic body corresponding to a region between one end of each of the first and second internal electrodes and the other end thereof in the length direction.

15. The board of claim 14, wherein when a thickness of the lower cover layer is defined as tc, the length of the ceramic body is defined as L, and a length of the first and second internal electrodes is defined as L2, $0.074 \leq L2/(tc \times (L-L2)) \leq 2.410$ is satisfied.

16. The board of claim 14, wherein when a thickness of the lower cover layer is defined as tc, the length of the ceramic body is defined as L, and a length of the first and second internal electrodes is defined as L2, $0.46 \leq (L-L2)/tc \leq 14.49$ is satisfied.

17. The board of claim 16, wherein the first and second internal electrodes include:
  a capacitance part in which adjacent internal electrodes are overlapped with one another to contribute to forming capacitance; and
  a lead part in which a portion of the capacitance part is extended to be exposed to the outside of the ceramic body.

18. The board of claim 17, wherein when an area of the lead part is defined as S1 and an area of a margin part of the ceramic body in a width direction of the ceramic body corresponding to a region between one ends of the first and second internal electrodes and the other ends thereof in the length direction is defined as S2, $0.12 \leq S1/S2 \leq 0.74$ is satisfied.

19. The board of claim 14, wherein the first and second internal electrodes are spaced apart from the first and second end surfaces of the ceramic body by a predetermined distance.

20. The board of claim 14, wherein the first and second external electrodes are extended to portions of the first and second main surfaces of the ceramic body.

* * * * *